United States Patent [19]

Buckner

[11] 4,115,728
[45] Sep. 19, 1978

[54] FREQUENCY-COMPARING DEVICES

[75] Inventor: Ian Wilfrid Buckner, Reading, England

[73] Assignee: Plessey Handel und Investments AG, Zug, Switzerland

[21] Appl. No.: 778,922

[22] Filed: Mar. 18, 1977

[30] Foreign Application Priority Data

Mar. 18, 1976 [GB] United Kingdom ............... 10861/76

[51] Int. Cl.² .............................................. H02P 5/06
[52] U.S. Cl. .................................... 318/318; 318/314
[58] Field of Search ................. 318/318, 314; 328/109

[56] References Cited

U.S. PATENT DOCUMENTS

| | | | |
|---|---|---|---|
| 3,295,039 | 12/1966 | MacDonal et al. ................... | 318/318 |
| 3,386,021 | 5/1968 | Fischer ................................. | 318/314 |
| 3,478,178 | 11/1969 | Grace .................................... | 318/318 |
| 3,493,834 | 2/1970 | Worrall ................................. | 318/314 |
| 3,500,160 | 3/1970 | Sommer ................................. | 318/318 |

Primary Examiner—David Smith, Jr.
Attorney, Agent, or Firm—Fleit & Jacobson

[57] ABSTRACT

A frequency-comparing device is arranged when in its no-output condition to respond to a pulse from a first one of two inputs by supplying a predetermined one of the two outputs until a pulse of another sequence arrives to terminate this output, whereafter the pulse next arriving will restore the same output if that pulse comes from the first input whereas if that pulse is one of the second input it will initiate the other output. Assuming that the pulse sequence from the first input has a frequency proportional to the speed of a motor unit and the pulse sequence from the second input consists of time pulses produced for example by a reference oscillator and that the output initiated by the arrival of a pulse from the first input is used as a drive-low input for the speed regulation unit of the motor while the other output constitutes a drive-high input for the same unit and that furthermore the pulse frequency derived from the motor speed is arranged to be equal to that derived from the reference oscillator when the motor runs at its desired speed, it will be found that when the motor speed is higher than the desired speed two pulses from the first input will from time to time occur within the interval between two consecutive pulses from the second input.

6 Claims, 3 Drawing Figures

FREQUENCY-COMPARING DEVICES

This invention relates to frequency-comparing devices and has for an object to provide an improved device which can be of simple construction and is capable when supplied with pulse sequences from two inputs, of producing selectively one or the other of two outputs according as, if the pulse sequence from the two inputs have the same pulse frequency, the pulses from one input are displaced in phase in one or the other direction relative to the pulses from the outer input or, if the pulse frequencies differ according as the pulse frequency from one input is higher or lower than that from the other input.

A broad aspect of the invention consists in a device for effecting a phase and frequency comparison of the pulses of two pulse sequences respectively applied at a first and a second input of the device, which has two output channels respectively associated with the two inputs and is arranged, when in a no-output condition, to respond to a pulse from either one of the two imputs by supplying an output to the output channel associated with said one input, and then to terminate this output at the arrival of a pulse from the other input, thereby restoring said no-output condition, wherafter the first further pulse from either input will cause an output to be supplied to that output channel which is associated with the input from which said further pulse is supplied. It will be readily appreciated that such a device when in its no-output condition, will respond to a pulse from a first one of the two inputs by supplying an output to a predetermined one of two output channels until a pulse of the other sequence arrives to terminates this output, whereafter the pulse next arriving will restore the same output if that pulse comes from the first input whereas if that next-arriving pulse is one of the second input, it will initiate output to the other output channel. Assuming that the pulse sequence from said first input has a frequency proportional to the speed of a motor unit and the pulse sequence from the second input consists of time pulses produced, for example, by a reference oscillator, and that the output initiated by the arrival of a pulse from the first input is used as a drive-low input for a speed-regulation unit of the motor while the other output constitutes a drive-high input for the same unit, and that furthermore the pulse frequency derived from the motor speed is arranged to be equal to that derived from the reference oscillator when the motor runs at its desired speed, it will be found that when the motor speed is higher than the desired speed, two pulses from the first input will from time to time occur within the interval between two consective pulses from the second input. At least from the moment this occurs, the pulses from the first input will be effective to produce successive periods of drive-low outputs, while the pulses from the second input will terminate these individual periods, and since no two pulses from the second input can occur in the interval between two pulses from the first input as long as the motor runs at more than its desired speed, the output will consist of alternate periods of drive-low output and of no output, until equality of frequency of the pulse sequences from the two inputs is achieved. When the two frequencies have become equal, there will be effectively no output if the pulses are also in phase, since any output initiated by a pulse from one of the inputs will substantially simultaneously be terminated by the corresponding pulse from the other input. When, on the other hand there is displacement in phase causing the pulses from the first input to arrive shortly before, or shortly after, the pulses from the second input, pulses of drive-low output or drive-high output respectively will be produced which will tend to synchronise the two sequences of pulses or, in other words, to eliminate the phase difference, and the effective length of the individual drive periods generated during each pulse period of the pulse sequences will be substantially proportional to the phase difference between the two sequences. Since when the two sequences of pulses are in phase, the drive pulses produced are (ideally) infinitely narrow and contain (ideally) zero energy, it will be appreciated that in this condition there is practically zero ripple in the output of the circuit.

One form of frequency-and-phase control device embodying the invention will now be described in more detail with reference of the accompanying drawings, in which.

Figure 3:
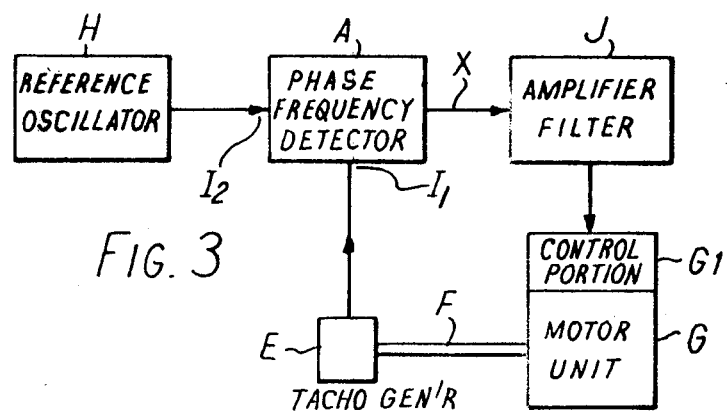

FIG. 3 similarly illustrates the connection between a circuit according to the invention and a motor unit whose speed and phase are to be controlled.

Figure 1:
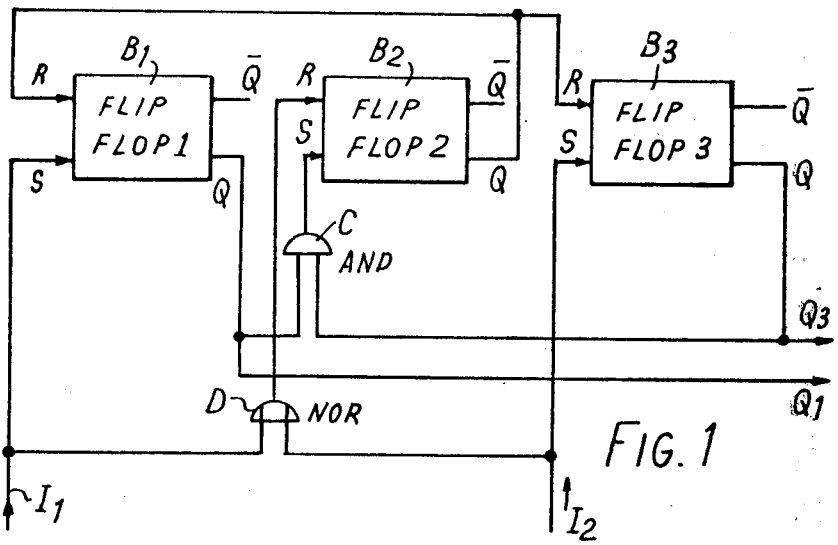
FIG. 1 is a circuit diagram illustrating a form of phase-and-frequency detector circuit.

Referring now to FIG. 1, the pulse of two sequences $I_1$ and $I_2$ whose respective pulse frequencies are $f_1$ and $f_2$, are applied respectively to the "set" inputs of two flip-flops $B_1$ and $B_3$ both of which are of the reset-set type, also briefly called R-S type. The first pulse arriving from either one of input sequences $I_1$ and $I_2$ when both flip-flops $B_1$ and $B_3$ are in their reset positions, will respectively cause either the associated flip-flop $B_1$ and to produce an output in line $Q_1$, which may be used as a drive-low output, or the associated flip-flop $B_3$ to produce in line $Q_3$ an output which may be used as a drive-high output. In addition the respective outputs obtained from the flip-flops $B_1$ and $B_3$ when the latter are in the "set" positions, are applied, via an AND gate G to the "set" input of a further R-S type flip-flop $B_2$, causing the latter to assume its "set" position as soon as both flip-flops $B_1$ and $B_3$ are simultaneously in their set positions, and the resulting output of this further flip-flop $B_2$ is applied to the "reset" inputs of both the first mentioned two flip-flops $B_1$ and $B_3$.

Resetting of the further flip-flop $B_2$ after it has performed its function of re-setting the other two flip-flops $B_1$ and $B_3$, is effected by means of a NOR gage D whose two inputs are conected to the two input-pulse sequences $I_1$ and $I_2$, as soon as there is simulataneous absence of pulses in both these input sequences.

It will be readily appreciated that when the pulses of the two sequences $I_1$ and $I_2$ have the same frequency and are in phase, each pulse of the two sequences will respectively place the flip-flop $B_1$ and $B_3$ into its "set" condition, but substantially at the same moment the output thus produced by the two said flip-flops will, via and AND gate C, produce a "set" condition in the additional flip-flop $B_2$, thereby resetting both the first mentioned flip-flops $B_1$ and $B_2$ so that neither of the outputs from flip-flops $B_1$ and $B_3$ will become effective.

If the frequencies of the two pulse sequences $I_1$ and $I_2$ are equal but one of them, for example sequence $I_1$, leads the other in phase, the first pulse arriving from the leading sequence ($I_1$) will set flip-flop $B_1$ to produce an output $Q_1$, which may be employed to reduce the frequency of sequence $I_1$, and this output will be maintained until cancelled by the resetting of flip-flop $B_1$ when, upon the arrival of the first pulse of the sequence $I_2$ at the flip-flop $B_3$, the combined outputs of the flip-flops $B_1$ and $B_3$ cause a further flip-flop $B_2$ to reset both the first-mentioned flip-flops $B_1$ and $B_3$ before the further flip-flop $B_2$ is itself reset in the above described manner. A similar cycle of operations will take place at each further pair of pulses of the two sequences $I_1$ and $I_2$ as long as the pulses of the sequence $I_1$ remains leading in phase; the length of each output pulse in line $Q_1$ will vary in accordance with the amount of lead, and it will also be readily appreciated that if, this "lead" becomes negative, i.e. if at any time the next-following pulse from the sequence $I_2$ arrives at flip-flop $B_3$ prior to the arrival of the next following pulse from sequence $I_1$ at the flip-flop $B_1$, the flip-flop $B_3$ will produce an output pulse in output line $Q_3$ and the length of this pulse in line $Q_3$ will be proportional to the lead in phase of the pulses from sequence $I_2$ over the pulses from sequence $I_1$. Furthermore if the frequency of the pulses from one sequence, for example from sequence $I_1$, is higher than the frequency of the pulses from the other sequence, then, even assuming that at the beginning the pulses from that sequence of lower frequency are leading in phase, this lead will, after a short time, disappear and be reversed and from that moment onwards output pulses will only appear in output line $Q_1$ unless and until the difference in frequency disappears or is reversed. Owing to the higher frequency of the first mentioned sequence, it will happen from time to time that a second pulse of this sequence will arrive before the arrival of the next pulse from the other sequence, i.e. at the time when the flip-flop to which it is applied is still in the "set" condition; this flip-flop will therefore be unaffected by the arrival of this particular pulse from the first sequence, so that the same output ($Q_1$) continues to be effective until interrupted by the arrival of the next-following pulse from the other sequence, whereafter the same output $Q_1$ will again become effective again upon the arrival of the following pulse from the first sequence because, owing to the higher frequency of that sequence, the arrival of this pulse will precede the arrival of the next-following pulse from the other sequence.

Figure 2:
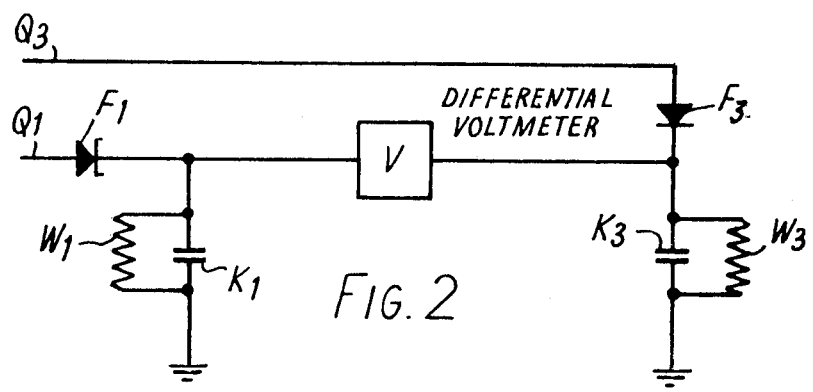
FIG. 2 is a circuit diagram of an arrangement by which the phase-and-frequency relations of the two inputs $I_1$ and $I_2$ of FIG. 1 can be visually indicated.

A detector circuit as described with reference to FIG. 1 may be used to obtain an indication of any phase and frequency differences between the sequences of pulses respectively applied at the two inputs. Such indication may be achieved by connecting the two input lines or channels $Q_1$ and $Q_3$ to the circuit shown in FIG. 2, which latter essentially comprises two integrator circuits each consisting of a rectifier $F_1$ and $F_3$ respectively, connected in series with a capacitor $K_1$ or $K_3$, each capcitor being bypassed by a shunt resistor $W_1$ and $W_3$ respectively, and a differential voltmeter V which interconnects the two integrated circuits at the point of each between the rectifier and the capacitor. If and as long as the pulses of input $I_1$ lead in phase over the pulses from input $I_2$, output pulses of equal length, corresponding to the amount of phase displacement, will appear at output $Q_1$ while no pulses will appear at output $Q_3$. A voltage proportional to the phase displacement will therefore build up in capacitor $K_1$ and will be indicated by thd differential voltmeter V by a corresponding deflection to one side. Conversely a condition in which the pulses of input $I_2$ lead over the pulses of input $I_1$ will be similarly indicated by a corresponding deflection to the opposite side. If the frequency of the pulses at $I_1$ is slightly higher than that of the pulses at input $I_2$, output pulses will again only occur in output $Q_1$, but the length of these pulses will vary at a rate proportional to the difference between the frequencies, so tht, at least at relatively low frequency differences, an indication will be observed at the differential voltmeter V which goes to the same side so that obtained when the pulses at input $I_1$ lead in phase over those of input $I_2$, but which will undulate in amplitude in accordance with the frequency difference, and similarly when the pulse frequency of input $I_2$ is higher than that of input $I_1$, the differential voltmeter will show a deflection of the opposite side, which similarly varies rhythmically at a rate proportional to the frequency difference.

FIG. 3 illustrates the utilisation of a phase-and-frequency detector circuit according to the invention for the control of a motor unit. This circuit which preferably is that of FIG. 1 is represented in FIG. 3 by a block A, to which a motor-speed-responsive input sequence $I_1$ of frequency of $f_1$ is supplied by a tacho-generator E driven by the shaft F of the controlled motor unit G, while the time-pulse sequence of frequency $f_2$ is supplied from a reference oscillator H. The drive-high output $Q_3$ and the drive-low output $Q_1$ of circuit A is supplied to a speed-control portion $G_1$ of the motor G by a line X via an amplifier-and-filter unit J in such a manner that the supply of drive-high output to the speedcontrol portion $G_1$ will increase, and the supply of drive-low output to the same portion $G_1$ will decrease the speed of the motor unit G.

It will be readily appreciated from the above description of FIG. 1, that when the pulses of sequence $I_1$ have a higher frequency than, or have a lead in phase over, the pulses of sequence $I_2$, the control unit $G_1$ will receive a sequence of drive-low pulses, thereby progresively reducing the speed of the motor G until the excess of the frequency, or the phase lead of the pulses of sequence $I_1$, over those of the sequence $I_2$ is eliminated or reversed. Conversely if the pulses of sequence $I_2$ have a higher frequency than, or lead in phase over, those of sequence $I_1$ the conrol unit $G_1$ will similarly act to increase the speed of the motor G. While the phase-and-frequency detector circuit illustrated in FIG. 1 is believed to be particularly simple and effective, the invention is not limited to the use of this particular circuit, which on the contrary may be replaced by any other circuit which will produce, in response to the supply of the two pulse sequences of respective frequencies $f_1$ and $f_2$, a drive-high output or a drive-low output in a similar manner to that in which the two outputs $Q_1$ and $Q_3$ are achieved by the circuit illustrated in FIG. 1.

What we claim is:

1. A device for effecting a phase and frequency comparison of the pulses of two pulse sequences respectively applied at a first and a second input of the device, which comprises a first and a second flip-flop unit of the reset-set type, respectively associated with the two inputs each flip-flop unit having a 'set' inlet connected to the input with which the unit is associated and an outlet operative in the 'set' condition and inoperative in the 'reset' condition of the unit, first and second output channels connected respectively to said outlets of said first and second flip-flop units for receiving output signals from the respective flip-flop outlets; an AND gate, having two inlets respectively connected to the said first and second output channels and an outlet connected to the 'set' inlet of a third flip-flop unit, said third flip-flop unit interconnected with said first and second flip-flop units and operative in its 'set' condition to supply a 'reset' input to both said first and second flip-flop units, and means for resetting the third flip-flop unit.

2. A device as claimed in claim 1, wherein the third flip-flop unit is of the reset-set type, and said means for resetting comprises a NOR gate having two control inlets respectively connected to the first and second inputs of the device and an output applied to a 'reset' connection of the third flip-flop unit.

3. A device as claimed in claim 2, wherein said first pulse source comprises a motor unit and a tacho-generator driven by said motor unit to constitute said source of adjustable frequency.

4. A device as claimed in claim 2, wherein said second pulse source comprises a reference oscillator of constant frequency.

5. A device for effecting a pulse-phase and pulse-frequency comparison of pulse sequences from a first and second pulse source, comprising a first and a second inlet for respective connection to said first and second pulse sources, first and second output channels, circuit means interconnecting said first and second inlets with said first and second output channels for providing a first output condition, in which an output signal is at said first output, a second output condition, in which an output signal is at said second output, and a no-output condition, when neither the first nor second output channels have output signals, said circuit means including means for responding to a pulse provided at either said first inlet or said second inlet when the device is in a no-output condition, for assuming the first output condition or said second output condition respectively, and means for restoring the device to its no-output condition when a pulse is thereafter provided to the opposite of said first inlet or second inlet.

6. A device as claimed in claim 5 further comprising a first pulse source of adjustable frequency, and a second pulse source, said first and second inlets connected respectively to said first and second pulse sources, a frequency control means for controlling the frequency of said first pulse source, and means for interconnecting said first and second output channels with said frequency control means to control the frequency of said pulses from said first pulse source.

* * * * *